United States Patent [19]

Beyl, Jr. et al.

[11] 4,284,954

[45] Aug. 18, 1981

[54] SEQUENTIAL LIGHT CIRCUIT

[75] Inventors: Earl L. Beyl, Jr.; William C. Cunningham, both of Louisville, Ky.

[73] Assignee: Traintronics Inc.

[21] Appl. No.: 31,859

[22] Filed: Apr. 20, 1979

[51] Int. Cl.³ .................... H03K 21/32; H03K 3/42
[52] U.S. Cl. .................. 328/75; 307/223 R; 307/311; 328/48
[58] Field of Search ............ 328/48, 75, 106, 130; 340/82; 307/223 R, 232, 269, 311

[56] References Cited

U.S. PATENT DOCUMENTS

| | | | |
|---|---|---|---|
| 3,272,994 | 9/1966 | Brown | 328/48 |
| 3,426,296 | 2/1969 | Christiansen et al. | 328/48 |
| 3,706,972 | 12/1972 | Okuhara | 340/82 |
| 3,984,810 | 10/1976 | Hudson, Jr. | 340/82 |
| 3,991,375 | 11/1976 | Riggs et al. | 328/130 |

Primary Examiner—Stanley D. Miller, Jr.
Assistant Examiner—B. P. Davis
Attorney, Agent, or Firm—Edward M. Steutermann

[57] ABSTRACT

A sequential activation control for selective sequential switching of at least two power circuits including: direct current power supply means to provide direct current source of power at selected voltage, clock means to provide output timing pulses at selected intervals, counter means, with counter controller means to receive the clock pulses having multiple electrical output means wherein a portion of the output means are serially activated by the counter controller in response to a selected number of clock pulses until a selected number of output means have been activated to provide a first activation cycle, multiple switch means, at least one switch means for each output means to be operated by selected output means, reset means to deactivate all of the switch means at selected time after the last output means has been activated so the clock means initiates a new activation cycle where the switch means are adapted to activate associated cooperative power circuits.

1 Claim, 1 Drawing Figure

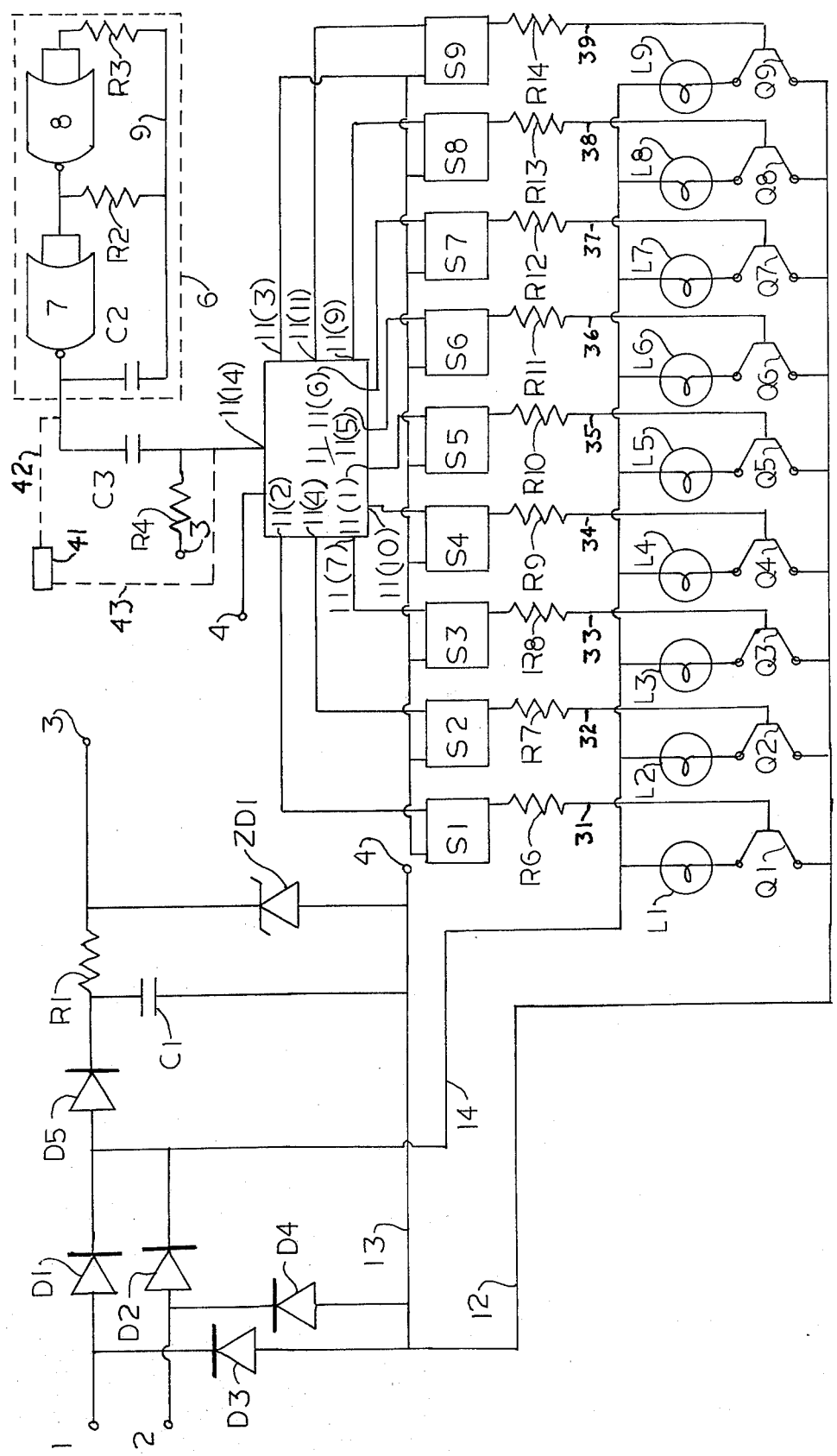

SEQUENTIAL LIGHT CIRCUIT

BACKGROUND OF THE INVENTION

The present invention relates to devices utilizing sequentially or serially activated power switches and more particularly to electronic means for accomplishing such switching in a predetermined time sequence.

Devices in accordance with the present invention find application in sequential activation of various devices on a regular basis to define a cycle of fixed time period where the cycle is automatically repeated until intentionally interrupted.

Devices in accordance with the present invention are particularly useful in activation and deactivation of signs of various description. One known class of prior art devised for such purposes, which are well known in the art have generally been of the electromechanical type where a mechanically driven arm or wiper is driven to sequentially open and close sets of electrical contacts to activate and deactivate associated power circuits, for example to turn on or turn off a number of lights of a sign.

It will be recognized that such devises have inherent disadvantages. For example, the mechanical drive for the contactor or wiper arm is susceptible to problems normally associated with mechanical devices such as breakage, or slippage where the connection between the arm of the drive malfunctions or misalignment where the wiper arm does not close the contact either as a result of wear of the contacts or wear of the arm.

In any event, such devices require significant maintenance for continued regular operation and, because of the complex electromechanical drive mechanisms needed for reliable operation, such prior art devices have been expensive to fabricate and in some cases the cost of fabrication precludes the utilization of such devices.

Moreover, such prior electromechanical devices have been expensive to fabricate because of the mechancial devices and, also because of the mechanical devices, have not been susceptible to miniaturization. Consequently such devices have not been available for use in miniature form, for example in model layout applications.

SUMMARY OF THE INVENTION

The present invention provides an efficient, essentially trouble free sequential activation circuit to serially activate and simultaneously deactivate a plurality of power circuits.

Devices within the scope of the present invention provide the necessary activation and deactivation entirely through the use of elective means where no troublesome electromechanical devices are needed.

Furthermore, devices within the scope of the present invention have low power requirements for the switching function but can be utilized so serially operate devices requiring virtually any electrical power.

Moreover, devices within the scope of the present invention are equally adaptable for use in the operation of large scale units, for example large commercial sizes and miniature applications, for example devices for use in model layouts.

More particularly, the present invention provides a sequential activation contact circuit for selective sequential switching of at least two power circuits including: direct current power supply means to provide a source of direct current at selected voltage, clock means devices by said power supply having a clock output to provide clock output timing pulses at selected intervals, counter means having input means to receive the clock output timing pulses, multiple output signal means, and controller means driven by the clock output timing pulses to serially activate a portion of the counter output signal means in response to a selected number of clock output timing pulses until a selected number of output signal means have been activated, thereby defining a counter activation cycle, at least one power circuit switch means connected in operative select relation to each of said counter output signal means to be switched to a first portion by activation of said counter output signal means, reset means to switch a portion of said switch means to second position a selected time interval after a selected switch means has been switched to first position and initiate a subsequent counter activation cycle.

It will be understood that the following is but one example of an arrangement within the scope of the present invention and that other arrangements within the scope of the present invention will occur to those skilled in the art upon reading the disclosure set forth hereinafter.

One example of the present invention shown in the accompanying drawings wherein:

FIG. 1 is a schematic illustration of one arrangement of a circuit within the scope of the present invention; and- As shown in FIG. 1, a power supply is provided to provide a source of DC voltage. In the example shown in FIG. 1, an AC power supply including leads 1 and 2 is provided where a rectifying arrangement including diodes D1-D4 is provided to supply a direct current at leads 12 and 14 which provide a power supply circuit as described hereinafter. It will be recognized that, in accordance with one feature of the present invention in certain applications an alternate source can be provided to supply power and to be activated by the control circuit described hereinafter. As shown in FIG. 1, the output from diodes D1 and D2 can be connected through the anode of a diode D5 and resistor R1 to a terminal 3 which provides the drain voltgage for the control circuit, as described hereinafter. Also, terminal 13 can be provided to a terminal 4 to provide the source supply voltage for the control circuit described hereinafter where capacitor C1 is provided between lead 10 and lead 13 with a series resistor R1 to provide a filter circuit to supply a smooth positive voltage at terminal 3. Terminal 3 is utilized to provide the drain supply voltage through resistor R4 to the output terminal 15 on a clock 6 which, for example, includes two quad 2 NOR gates arranged as shown where capacitors C3 and resistor R4 to provide an integrator to reduce the width of the negative pulse output of the clock at the input 1114 to a counter 11 described hereinafter. It will be understood that within the scope of the present invention any clock device can be utilized which provides a regularly timed out-put signal. The clock is a preestablished timing clock where the period of the positive output pulse is determined by the characteristics of the clock and any particular characteristic can be selected to operate Counter 11. Counter 11 has 10 outputs, (11(2), 11(4), 11(7), 11(10), 11(1), 11(5), 11(6), 11(9), 11(11), and 11(3)) which are activated in that order in response to clock pulses. In the arrangement shown, a RCA decade counter/divider No. CD14017 is provided so that a new output is activated with each pulse from clock six. Within the scope of the present invention any ratio of clock pulses to output activation of the counter can be provided.

For example in the arrangement shown for every clock output pulses transmitted through lead 15 an additional counter output is activated. Specifically, for the next pulse from clock 6 output 11(2) is activated then deactivated when during the next pulse period output 11(4) is activated and so forth. In the arrangement shown each of the outputs 11(2), (4), (7), (10), (1), (5), (6), (9), (11) is attached to a latch S1-S9 respectively. As shown in the Figure, latches S1-S9 are RS flip flops utilizing two quad 2-input (NOR) gates so that upon activating, for example, output 11(2) latch S1 is energized to provide an output signal through a terminal 31 to activate a switch, for example in this case a transistor Q1 where terminal 31 is connected to the base of transistor Q1. Likewise each of the output terminals 32-39 is connected respectively, to the base of a transistor Q2-Q9.

Likewise, in the illustration shown in the Figure each of the transistors Q1-Q9 is connected across leads 12, 14 in series with a light L1-L9, so that upon activation of transistor Q1-Q9 each of the lights L1-L9 responds and stays activated until the associated transistor is turned off.

Within the scope of the present invention the final output 11(3) of counter 11 is connected to the reset terminal of each of the latches S1-S9 so that upon activation of output 11(3) each of the latches S1-S9 is reset and each of the terminals 31-39 is turned off thus deactivating transistors Q1-Q9 and turning off lights L1-L9.

It will be recognized that the arrangement shown in FIG. 1 is particularly applicable for low voltage applications where lights L1-L9 are low voltage DC bulbs. On the otherhand arrangements within the scope of the present invention can be utilized where devices to be tuned in consume significant quantities of power and where lines 12 and 14 provide an alternating source of current. In such arrangements transistors Q1-Q9 can be replaced by appropriate switching devices, for example triac-type devices.

Also in such arrangements the life of the lights L1-L9 can be important and in such arrangements a zero crossing device 41, as is known in the art can be provided where such devices shown in the Figure are connected through the clock by dotted leads 42, 43. Such devices insure that the switching occurs only at a voltage close to zero to extend the life of the light bulbs L1-L9.

In operation of the device shown in the Figure operation is initiated with each clock pulse and remains activated until counter output 11(3) is activated. Once activated latch S2 holds outlet terminal 31 in the "on" position until latch S1 is reset by activation of output 11(3). Subsequently Latch S2 and output 32 are activated and remain activated until reset by activation of output 11(3). The same procedure is followed until all 9 latches S9 are in the active position thus activating all 9 output leads on 31-39 so that all 9 transistors Q1-Q9 are activated and all lights L1-L9 are burning. After the conclusion of the last inpulse, output 11(3) is activated to reset the latches S1-S9 and turn off all the lights L1-L9. At this point one complete counter cycle has been completed and a new cycle starts.

Arrangements within the scope of the present invention are particularly useful in the fabrication of sequentially activated signs where each of the lightbulbs L1-L9 is provided in a separate letter or portion of the sign so that a progressive sign is provided.

Likewise it will be understood within the scope of the present invention any number of lights and latches can be provided depending upon the configuration desired and upon the particular characteristics of the clock 6 and the counter 11 and no limitation is intended with respect to the number of lights to be utilized.

It is to be further understood that various other arrangements when in the scope of the present invention will become obvious to those skilled in the art upon reading the disclosure set forth hereinbefore.

The invention claimed is:

1. A sequential activation control for sequential activation and uniform deactivation of at least two power circuits including: clock means to provide regularly occurring uniform length timing pulses at selected intervals, counter means, with counter controller means to receive the clock pulses and having multiple electrical output signal means wherein each of said output signal means is sequentially activated by the counter controller in response to selected number of clock pulses received by said counter means until a selected number of said output signal means have been activated to provide a first activation cycle, multiple switch means, where at least one switch means is provided for each output signal means to be activated by its associated output signal means; reset end means to simultaneously deactivate all of the switch means and output signal means at selected time after the last output signal means has been activated and to cause said clock means to initiate a new activation cycle where the switch means are adapted to activate associated cooperative power circuits, including light means; and power supply means to supply uniform direct current electrical power to said clock means, said counter means and said switch means.

* * * * *